US010772234B2

(12) United States Patent
Hayashi

(10) Patent No.: US 10,772,234 B2
(45) Date of Patent: Sep. 8, 2020

(54) COOLING DEVICE AND ELECTRONIC DEVICE SYSTEM

(71) Applicant: FUJITSU LIMITED, Kawasaki-shi, Kanagawa (JP)

(72) Inventor: Nobuyuki Hayashi, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 138 days.

(21) Appl. No.: 15/899,132

(22) Filed: Feb. 19, 2018

(65) Prior Publication Data
US 2018/0249590 A1     Aug. 30, 2018

(30) Foreign Application Priority Data
Feb. 28, 2017   (JP) .................................. 2017-036137

(51) Int. Cl.
*H05K 7/20*   (2006.01)
*H01L 23/42*  (2006.01)
(Continued)

(52) U.S. Cl.
CPC ............. *H05K 7/202* (2013.01); *H01L 23/42* (2013.01); *H01L 23/473* (2013.01);
(Continued)

(58) Field of Classification Search
CPC ....... H01L 23/42; H01L 23/473; H01L 23/44; H05K 7/202; H05K 7/20254; H05K 7/20272; H05K 7/20709; H05K 7/20772; H05K 7/20781; H05K 7/20218; G01F 1/20; G01F 2200/201
See application file for complete search history.

(56) References Cited

U.S. PATENT DOCUMENTS 6,973,801 B1    12/2005  Campbell et al.
2004/0221604 A1*  11/2004  Ota ..................... H05K 7/20781
                                                                 62/259.2
(Continued)

FOREIGN PATENT DOCUMENTS

JP    2008-509542    3/2008
JP    2008523599     7/2008
(Continued)

OTHER PUBLICATIONS

JPOA—Notice of Reasons for Refusal dated Jun. 30, 2020 in Japanese Patent Application No. 2017-036137, with full English translation of the Notice of Reasons for Refusal.

*Primary Examiner* — Elizabeth J Martin
(74) *Attorney, Agent, or Firm* — Fujitsu Patent Center

(57) ABSTRACT

A cooling device includes: coolers; a water-supply pipe that has branch pipes and supplies a coolant to the coolers, each of the branch pipes being coupled with each of the coolers; and a waste pipe that has branch pipes, each of which is coupled with each of the coolers. The coolant having passed through the coolers is exhausted to the waste pipe. The cooling device also includes a circulation pipe that couples an inlet of the water-supply pipe with an outlet of the waste pipe and has a pump to discharge the coolant and a coolant cooler to cool the coolant. The cooling device also includes a bypass flow path that is coupled with at least a top edge portion of the water-supply pipe, bypasses the plurality of coolers, and is coupled with the waste pipe.

11 Claims, 10 Drawing Sheets

(51) Int. Cl.
*H01L 23/473* (2006.01)
*H01L 23/44* (2006.01)

(52) U.S. Cl.
CPC ..... *H05K 7/20254* (2013.01); *H05K 7/20272* (2013.01); *H05K 7/20709* (2013.01); *H05K 7/20781* (2013.01); *H01L 23/44* (2013.01)

(56) References Cited

U.S. PATENT DOCUMENTS

| | | |
|---|---|---|
| 2006/0002086 A1 | 1/2006 | Nicholas et al. |
| 2007/0193285 A1 | 8/2007 | Knight et al. |
| 2013/0020058 A1 | 1/2013 | Suzuki et al. |

FOREIGN PATENT DOCUMENTS

| | | |
|---|---|---|
| JP | 2012181714 | 9/2012 |
| JP | 2013-26526 | 2/2013 |
| JP | 2013030028 | 2/2013 |
| JP | 2014-183107 | 9/2014 |
| WO | 2006061404 | 6/2006 |

* cited by examiner

S2≦S1

S3 ≦ S4

COOLING DEVICE AND ELECTRONIC DEVICE SYSTEM

CROSS-REFERENCE TO RELATED APPLICATION

This application is based upon and claims the benefit of priority of the prior Japanese Patent Application No. 2017-036137, filed on Feb. 28, 2017, the entire contents of which are incorporated herein by reference.

FIELD

A certain aspect of embodiments described herein relates to a cooling device and an electronic device system.

BACKGROUND

Conventionally, various cooling devices or cooling units for cooling an electronic device are being supposed (for example, see Japanese Patent Application Publication No. 2014-183107 and Japanese Patent Application Publication No. 2013-26526). For example, it is supposed that coolant is circulated on a heating component such as a CPU (Central Processing Unit) in order to independently cool electronic devices arrayed in a layered shape, as in a case of a server using a rack mount method (for example, see Japanese Patent Application Publication No. 2008-509542). In this manner, in a method of cooling an electronic device by circulating coolant, it is possible to respond to a condition that an air cooling fan for independently cooling electronic devices arrayed in a layered shape cannot be mounted and a condition that the number of electronic devices arrayed in a layered shape increases.

SUMMARY

Coolant is divided from a water-supply pipe into coolers provided in a plurality of electronic devices in order to cool the plurality of electronic devices arrayed in a layered shape. However, the coolant may include dissolved air. When a cooling device is continuously operated, the dissolved air may become gaseous air and may be accumulated in a water-supply pipe. When coolant including the gaseous air flows into each cooler, cooling efficiency of each cooler may be degraded. The gaseous air is accumulated in an upper portion of the water-supply pipe. Therefore, when the electronic devices are arrayed in a layered shape in an up-down direction, it is thought that cooling efficiency of an electronic device on an upper step may be degraded. Even if the electronic devices are arrayed in a layered shape in a right-left direction, the coolant including the gaseous air may flow into the cooler.

According to an aspect of the present invention, there is provided a cooling device including: a plurality of coolers, each of which is provided in each of a plurality of electronic devices that are arrayed in a layered shape; a water-supply pipe that has a plurality of branch pipes and supplies coolant to the plurality of coolers, each of the branch pipes being coupled with each of the plurality of coolers; a waste pipe that has a plurality of branch pipes, each of which is coupled with each of the plurality of coolers, the coolant having passed through the plurality of coolers being exhausted to the waste pipe; a circulation pipe that couples an inlet of the water-supply pipe with an outlet of the waste pipe and has a pump configured to discharge at least the coolant and a coolant cooler configured to cool the coolant; and a bypass flow path that is coupled with at least a top edge portion of the water-supply pipe, bypasses the plurality of coolers, and is coupled with the waste pipe or the circulation pipe.

According to another aspect of the present invention, there is provided an electronic device system including: a plurality of electronic devices arrayed in a layered shape; and a cooling device configured to cools an object to be cooled of the plurality of electronic devices, wherein the cooling device includes: a plurality of coolers, each of which is provided in each of the plurality of electronic devices that are arrayed in a layered shape; a water-supply pipe that has a plurality of branch pipes and supplies coolant to the plurality of coolers, each of the branch pipes being coupled with each of the plurality of coolers; a waste pipe that has a plurality of branch pipes, each of which is coupled with each of the plurality of coolers, the coolant having passed through the plurality of coolers being exhausted to the waste pipe; a circulation pipe that couples an inlet of the water-supply pipe with an outlet of the waste pipe and has a pump configured to discharge at least the coolant and a coolant cooler configured to cool the coolant; and a bypass flow path that is coupled with at least a top edge portion of the water-supply pipe, bypasses the plurality of coolers, and is coupled with the waste pipe or the circulation pipe.

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

A description will be given of embodiments on the basis of drawings. However, there may be a case where a size or a ratio of each component does not coincide with those of each actual component. There may be a case where elements that actually exist are omitted for simplicity. There may be a case where a size is exaggeratingly illustrated.

First Embodiment

Figure 1:
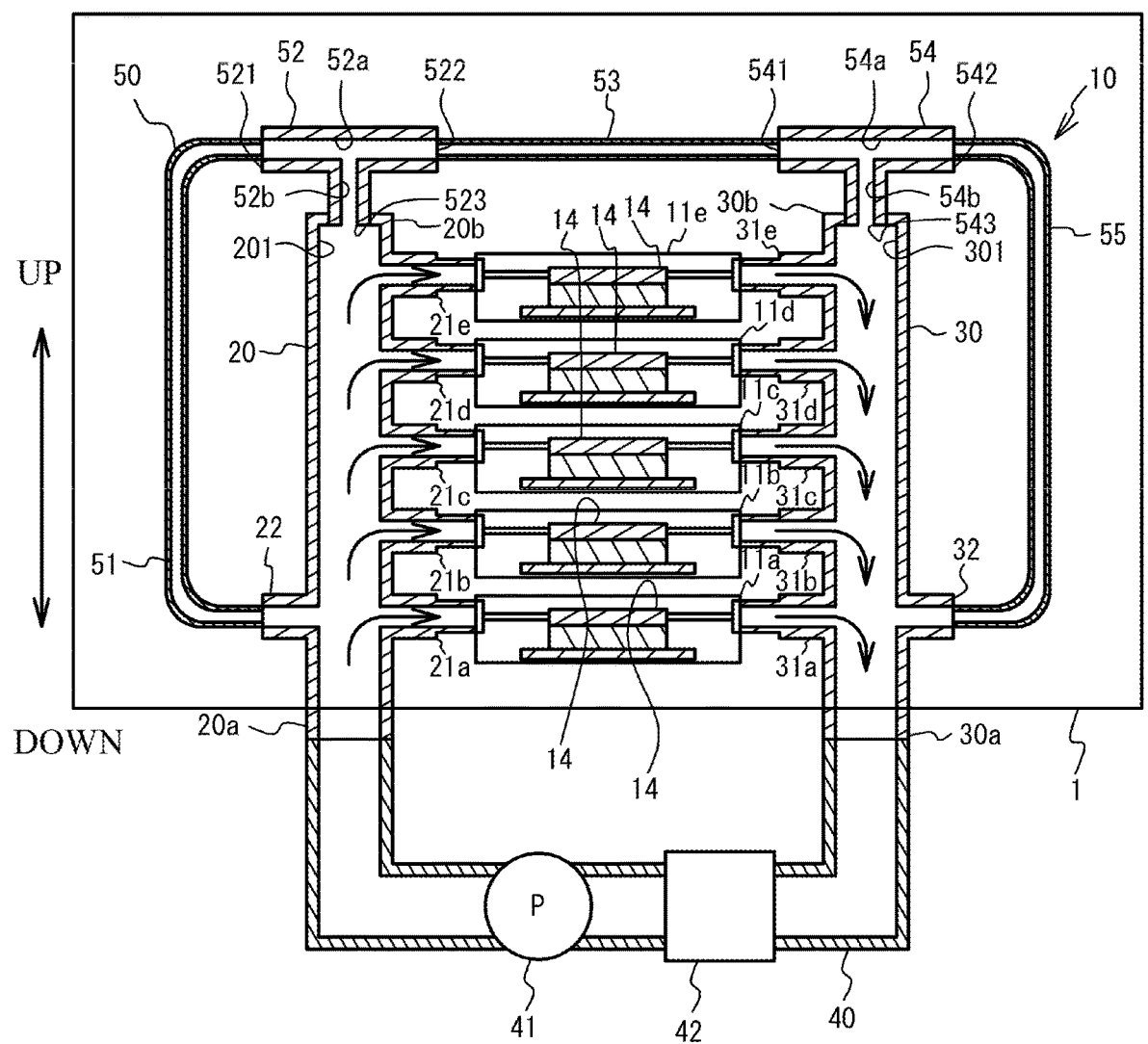
FIG. 1 schematically illustrates an outline structure of an electronic device system having a cooling device in accordance with a first embodiment.
Figure 2:
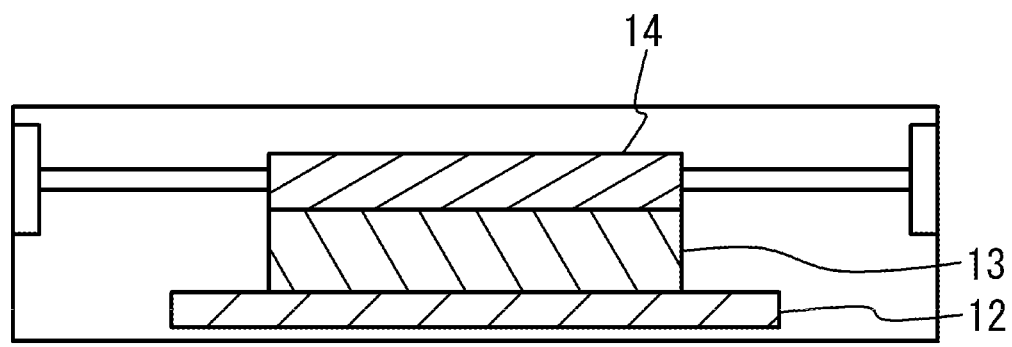
FIG. 2 schematically illustrates a server blade as an example of an electronic device.
Figure 3A:
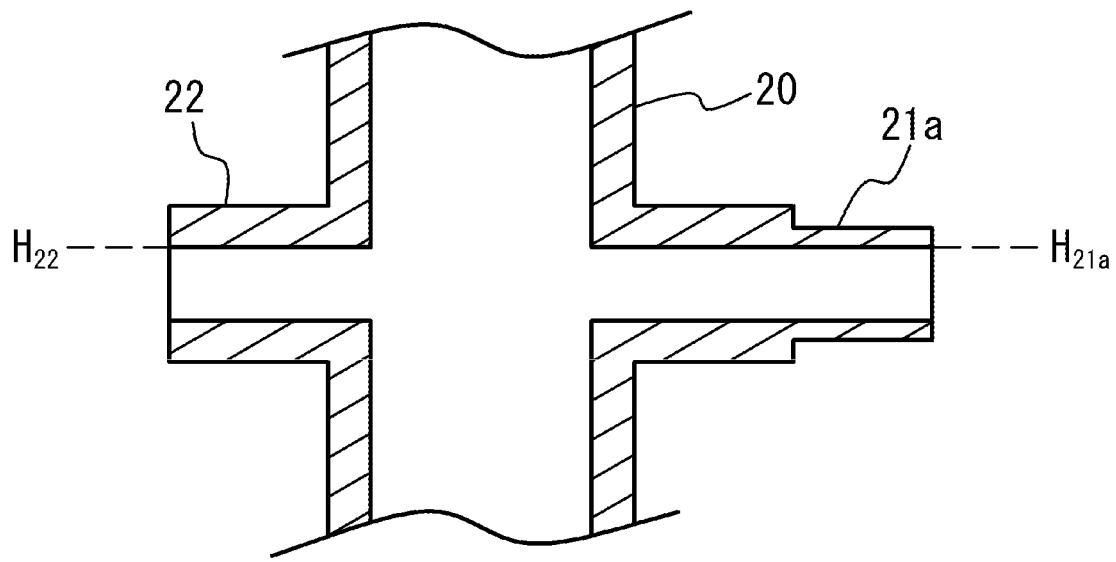
FIG. 3A illustrates an example in which a height position of a starting edge pipe of a water-supply pipe coincides with a height position of a branch pipe of a bottom step.
Figure 3B:
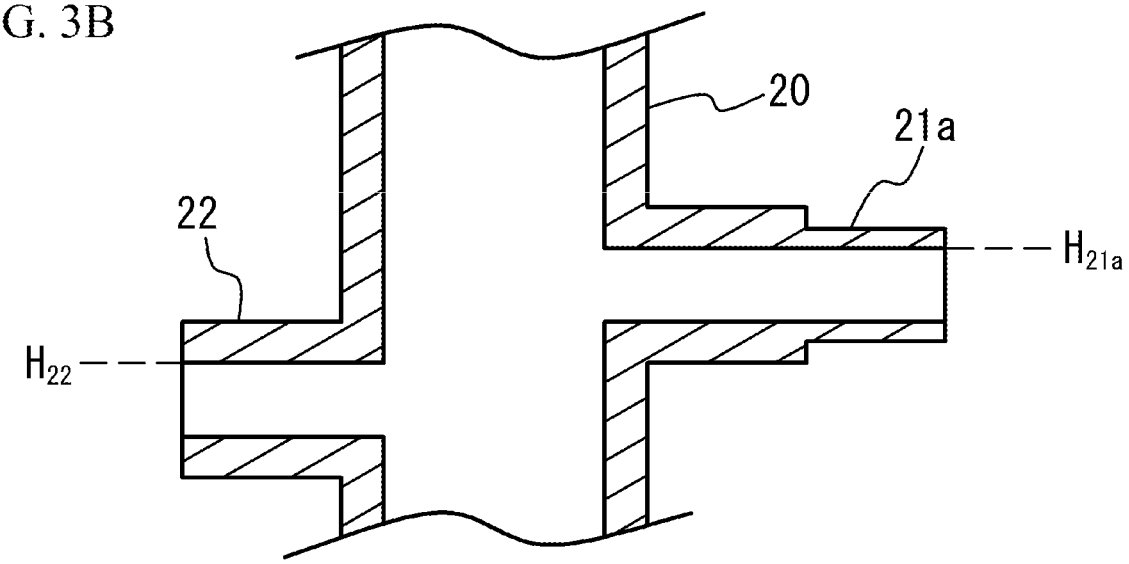
FIG. 3B illustrates an example in which a height position of a starting edge pipe of a water-supply pipe is lower than a height position of a branch pipe of a bottom step.
Figure 4A:
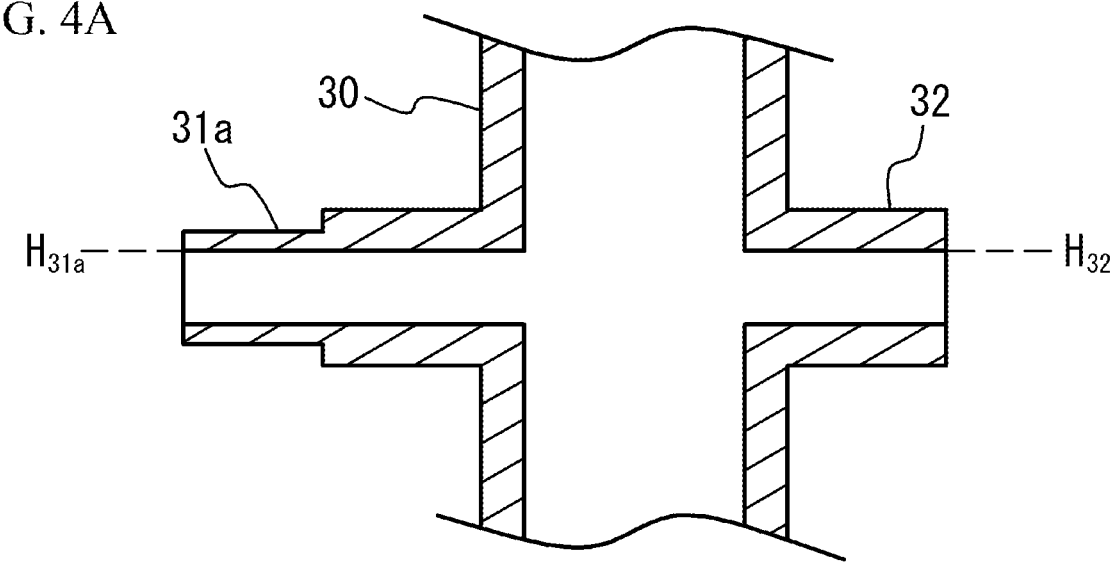
FIG. 4A illustrates an example in which a height position of an ending edge pipe of a waste pipe coincides with a height position of a branch pipe of a bottom step.
Figure 4B:
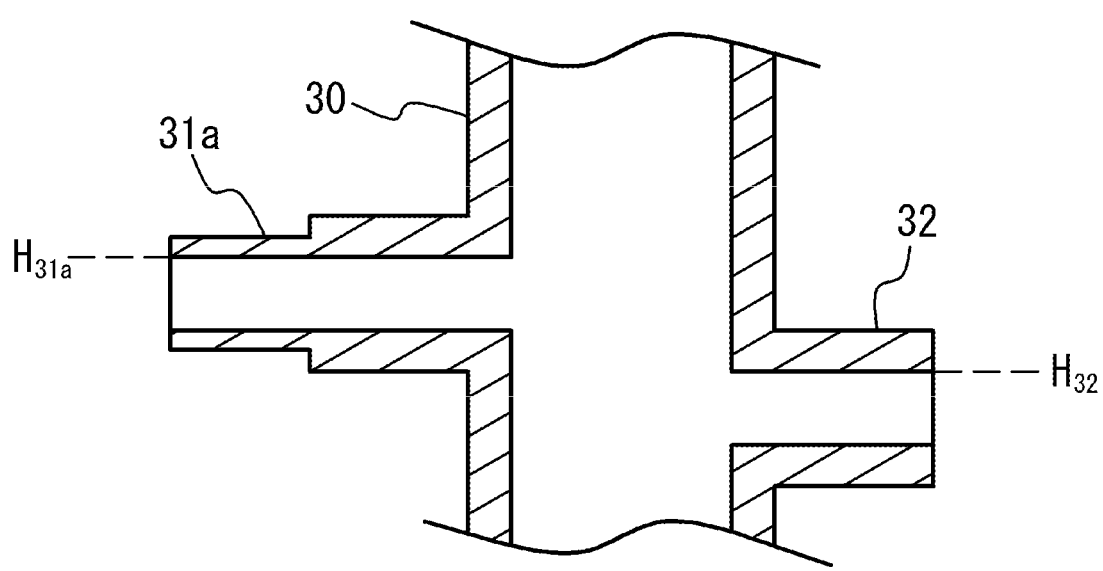
FIG. 4B illustrates an example in which a height position of an ending edge pipe of a waste pipe is lower than a height position of a branch pipe of a bottom step.
Figure 5A:
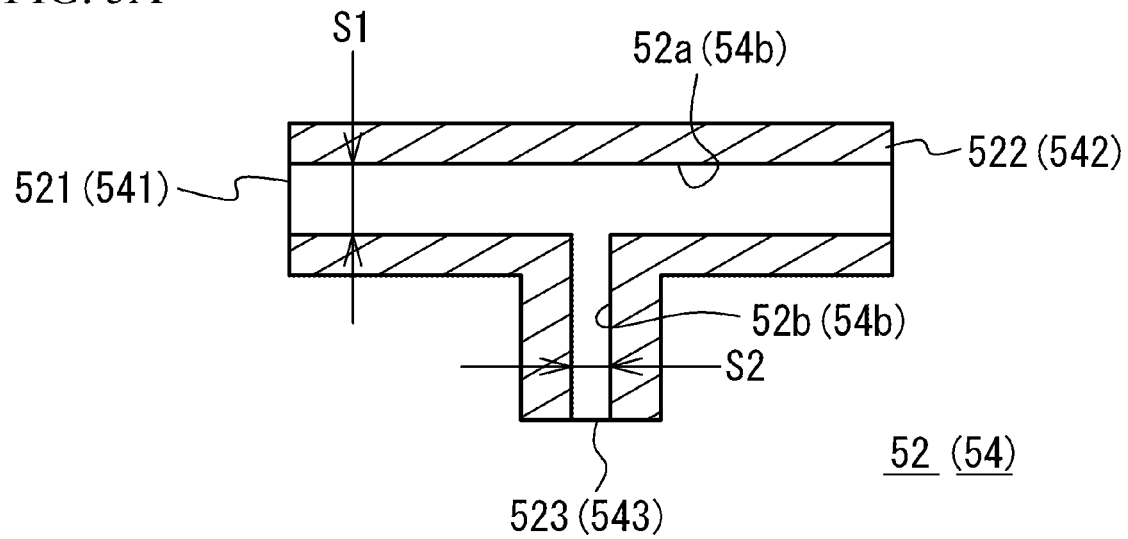
FIG. 5A illustrates a first connection member.
Figure 5B:
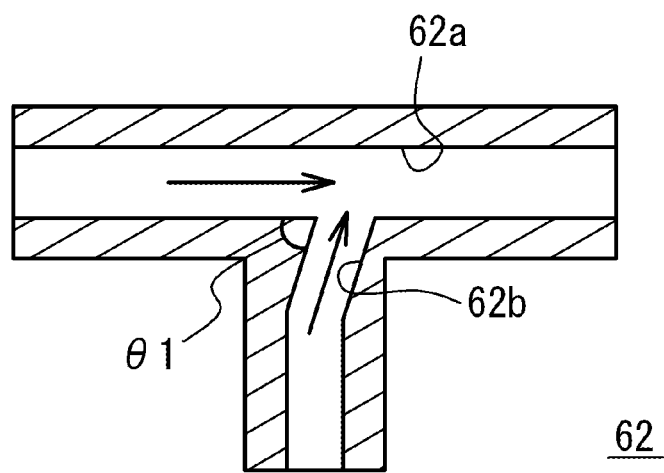
FIG. 5B illustrates a modified embodiment of a first connection member.
Figure 6:
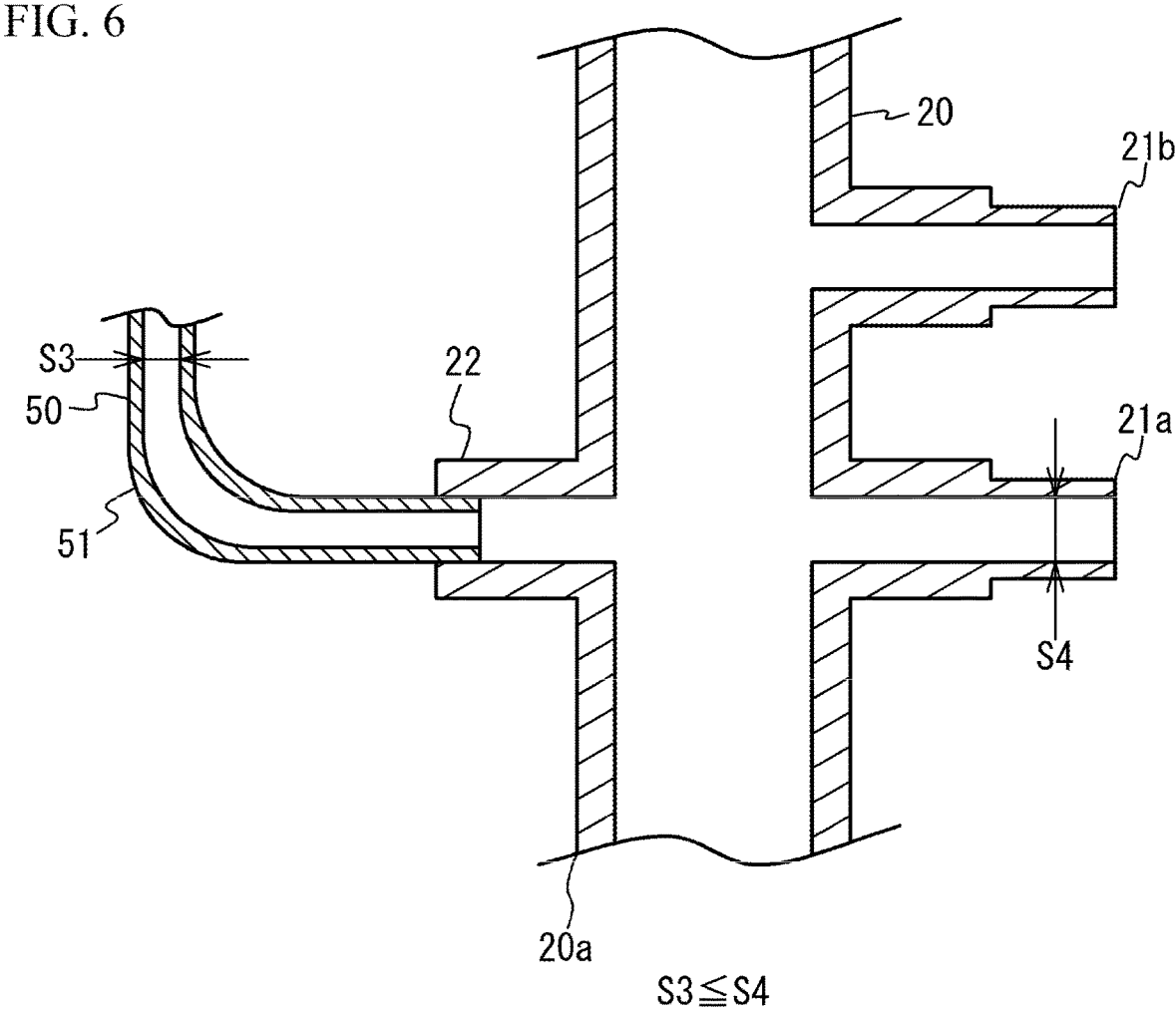
FIG. 6 illustrates a flow path cross section area of a bypass flow path and a flow path cross section area of a branch pipe.

A description will be given of an electronic device system 1 having a cooling device 10 in accordance with a first embodiment, with FIG. 1 to FIG. 6. FIG. 1 schematically illustrates an outline structure of the electronic device system 1 having the cooling device 10 in accordance with the first embodiment. FIG. 2 schematically illustrates a server blade as an example of an electronic device. FIG. 3A illustrates an example in which a height position of a starting edge pipe of a water-supply pipe coincides with a height position of a branch pipe of a bottom step. FIG. 3B illustrates an example in which the height position of the starting edge pipe of the water-supply pipe is lower than the height position of the branch pipe of the bottom step. FIG. 4A illustrates an example in which a height position of an ending edge pipe of a waste pipe coincides with a height position of a branch pipe of the bottom step. FIG. 4B illustrates an example in which the height position of the ending edge pipe of the waste pipe is lower than the height position of the branch pipe of the bottom step. FIG. 5A illustrates a first connection member. FIG. 5B illustrates a modified embodiment of the first connection member. FIG. 6 illustrates a flow path cross section area of a bypass flow path and a flow path cross section area of a branch pipe. A direction indicated with an arrow in FIG. 1 and so on is an up-down direction.

As illustrated in FIG. 1, the electronic device system 1 in accordance with the first embodiment is a server system adopting a rack mount method. The electronic device system 1 has a plurality of server blades 11a to 11e that are arrayed in a layered shape. The server blades 11a to 11e are examples of the electronic device. The server system is an example of the electronic device system. In the embodiment, five server blades are used. However, the number of the server blades is not limited to five.

As illustrated in FIG. 2, each of the server blades 11a to 11e has a semiconductor package 13 mounted on a substrate 12. The semiconductor package 13 is an object to be cooled in the embodiment. A cooling plate 14 acting as a cooler is mounted on each of the semiconductor packages 13. The server blades 11a to 11e are arrayed in a rack in a layered shape in an up-down direction. In concrete, the server blade 11a is positioned at a bottom step. The server blade 11e is positioned at a top step. Therefore, the cooling plates 14 mounted in the server blades 11a to 11e are also arrayed in a layered shape in the up-down direction. The cooling device 10 includes the cooling plates 14. In the cooling plates 14, a flow path in which a coolant flows is formed. When the coolant takes heat from the semiconductor package 13, the semiconductor package 13 can be cooled. The cooling plates 14 of the embodiment are formed with copper having excellent thermal conductivity from the semiconductor package 13 to the coolant. A material of the cooling plate 14 may be a material other than copper, such as copper alloy, aluminum, or aluminum alloy. Moreover, the material of the cooling plate 14 may be an inorganic material such as a diamond, a carbon composite or aluminum nitride. The coolant of the embodiment is water. However, aqueous solution of which a main component is water may be used. The coolant is not limited. The coolant may be another conventional coolant such as propylene glycol anti-freezing fluid.

As illustrated in FIG. 1, the electronic device system 1 has the cooling device 10. The cooling device 10 has the cooling plates 14 mounted in the server blades 11a to 11e, the water-supply pipe 20 for supplying the coolant to the cooling plates 14, and a waste pipe 30 for wasting the coolant having passed through the cooling plates 14. In the water-supply pipe 20, a water-supply path 201 is formed. In the waste pipe 30, a waste path 301 is formed.

The water-supply pipe 20 has branch pipes 21a to 21e that extend in the up-down direction, are branched from the water-supply path 201 and are connected to the cooling plates 14. The branch pipes 21a to 21e are arrayed in parallel along a longitudinal direction of the water-supply pipe 20. The longitudinal direction is the up-down direction. The number of the branch pipes 21a to 21e is the same as the number of the cooling plates 14. The water-supply pipe 20 has a water-supply inlet 20a having an opening toward a lower face.

The waste pipe 30 extends in the up-down direction, is branched from the waste path 301, and has branch pipes 31a to 31e connected to the cooling plates 14. The branch pipes 31a to 31e are arrayed in parallel along a longitudinal direction of the waste pipe 30. The longitudinal direction is the up-down direction. The number of the branch pipes 31a to 31e is the same as the number of the cooling plates 14. The waste pipe 30 has an outlet 30a having an opening toward a lower face.

The cooling device 10 has a circulation pipe 40 connecting the water-supply inlet 20a of the water-supply pipe 20 with the outlet 30a of the waste pipe 30. The circulation pipe 40 has a pump 41 for discharging the coolant and a heat exchanger 42 for accumulating the coolant and cooling the coolant. The heat exchanger 42 forms a chiller unit for cooling the coolant together with a reserve tank. The heat exchanger 42 is arranged on the upstream side of the pump 41. Thus, the coolant cooled in the heat exchanger 42 is discharged by the pump 41. The heat exchanger 42 is what is called a radiator, and is a part of a cooler for coolant. The cooler for coolant may be conventional various means for cooling the coolant. The circulation pipe 40 is extracted to outside of a rack in which the server blades 11a to 11e are provided. The pump 41 and the heat exchanger 42 are provided outside of the rack. The coolant discharged by the pump 41 is introduced to the water-supply path 201 in the water-supply pipe 20 from the water-supply inlet 20a and is divided into the branch pipes 21a to 21e. The coolant is supplied to the cooling plates 14. The coolant taking heat from the semiconductor package 13 in the cooling plates 14 is exhausted to the waste path 301 in the waste pipe 30. The coolant exhausted to the waste path 301 is transferred to the heat exchanger 42 and is cooled. The coolant is transferred to the water-supply pipe 20 again by the pump 41. In the embodiment, the water-supply pipe 20, the waste pipe 30 and the circulation pipe 40 are independently manufactured and are connected with each other. Thus, a part of the circulation loop of the coolant is formed. However, these may not be necessarily distinguished from each other. For example, a downstream side of the pump 41 may be integrally formed with the water-supply pipe 20. An upstream side of the heat exchanger 42 may be integrally formed with the waste pipe 30. That is, a loop, in which the coolant discharged from the pump 41 circulates, is formed.

The water-supply pipe 20 is branched at the bottom edge portion and has a starting edge pipe 22 acting as a starting point of a bypass flow path 50 described later. The waste pipe 30 is branched at the bottom edge and has an ending edge pipe 32 acting as an ending point of the bypass flow path 50. The coolant discharged from the pump 41 flows into the starting edge pipe 22, passes through the bypass flow path 50, and is collected to the waste pipe 30 through the ending edge pipe 32. And, the coolant is transferred to the heat exchanger 42.

A description will be given of a height position of the starting edge pipe 22. The starting edge pipe 22 may be positioned at lower than the cooling plate 14 of the bottom step among the cooling plates 14 that are arrayed in the layered shape in the up-down direction. In the embodiment, as illustrated in FIG. 3A, the highest position $H_{22}$ of an inner circumference wall of the starting edge pipe 22 is the same as the highest position $H_{21a}$ of an inner circumference wall of the first branch pipe 21a connected to the cooling plate 14 of the bottom step. The coolant divided from the water-supply path 201 flows into the starting edge pipe 22. Therefore, a flow amount in the water-supply path 201 decreases on the downstream side with respect to the position at which the starting edge pipe 22 is provided. Therefore, for example, on a presumption that the position of the starting edge pipe 22 is around a middle step, it is thought that variability of the flow amount becomes larger around the lower step and after the middle step. It is thought that there is little influence on the divided amount into the branch pipes 21a to 21e, even if the position of the starting edge pipe 22 is set as in the case of the embodiment. On the basis of the idea, the height position of the starting edge pipe 22 may be set. That is, as illustrated in FIG. 3B, the highest position $H_{22}$ of the inner circumference wall of the starting edge pipe 22 may be positioned at lower than the highest position $H_{21a}$ of the inner circumference wall of the first branch pipe 21a connected to the cooling plate 14 of the bottom step. With the positions, it is possible to smooth the distributed amount of the coolant into the branch pipes 21a to 21e. In the embodiment, the branch pipe 21a is positioned at the most upstream side, and the branch pipe 21e is positioned at the most downstream side. Moreover, the branch pipe 21a is positioned at the bottom step, and the branch pipe 21e is positioned at the top step. Therefore, the positions may have influence on the distributed amount of the coolant. However, it is possible to equalize the distributed amount by adjusting an output of the pump 41 or the like.

Next, a description will be given of the height position of the ending edge pipe 32. The ending edge pipe 32 may be positioned at lower than the cooling plate 14 of the bottom step among the cooling plates 14 arrayed in the layered shape in the up-down direction. In the embodiment, as illustrated in FIG. 4A, the highest position $H_{32}$ of the inner circumference wall of the ending edge pipe 32 is the same as the highest position $H_{31a}$ of the inner circumference wall of the first branch pipe 31a connected to the cooling plate of the bottom step. The coolant including gaseous air returns to the ending edge pipe 32 through the bypass flow path 50, as described later. It is preferable that the gaseous air is exhausted from the outlet 30a without returning to the waste path 301 in the waste pipe 30, so that the gaseous air does not enter the branch pipes 31a to 31e again. Therefore, it is preferable that the ending edge pipe 32 is positioned at lower side as possible. When the position of the ending edge pipe 32 is set as in the case of the embodiment, it is thought that entering of the gaseous air into the branch pipes 31a to 31e is suppressed. With the idea, it is possible to set the height position of the ending edge pipe 32. That is, as illustrated in FIG. 4B, the highest position $H_{32}$ of the inner circumference wall of the ending edge pipe 32 may be lower than the highest position $H_{31a}$ of the inner circumference wall of the first branch pipe 31a connected to the cooling plate 14 of the bottom step. It is therefore possible to appropriately suppress the entering of the gaseous air into the branch pipes 31a to 31e.

In the embodiment, the ending edge pipe 32 is provided in the waste pipe 30. Therefore, the end point of the bypass flow path 50 is the waste pipe 30. However, the bypass flow path 50 may be connected with the circulation pipe 40. In concrete, the bypass flow path 50 may be connected to the upstream side of the heat exchanger 42 acting as a cooler of the coolant, in the circulation pipe 40. It is therefore possible to suppress entering of the gaseous air into the branch pipes 31a to 31e, even if the bypass flow path 50 is connected with the circulation pipe 40.

The cooling device 10 has the bypass flow path 50. The bypass flow path 50 bypasses the cooling plates 14. A start point of the bypass flow path 50 is the starting edge pipe 22. The end point of the bypass flow path 50 is the ending edge pipe 32. The bypass flow path 50 is connected with a top edge portion 20b of the water-supply pipe 20. The bypass flow path 50 is connected with the top edge portion 20b of the water-supply pipe 20 because the gaseous air is accumulated in the top edge portion of the water-supply pipe 20.

A description will be given of the gaseous air that may be included in the coolant. The cooling plates 14 and other pipes are not filled with the coolant in an initial step of the manufacturing of the cooling device 10. The cooling device 10 is filled with the coolant in a mounting step of the electronic device system 1. When the cooling device 10 is filled with the coolant in a room temperature, the coolant may include dissolved air. When an operation of the cooling device 10 starts under a condition that the coolant includes the dissolved air, the dissolved air becomes gaseous air because of changing of the temperature or the pressure of the coolant. The gaseous air moves upward in liquid. Therefore, the gaseous air is accumulated in a top edge portion of the water-supply pipe 20. The gaseous air accumulated in the top edge portion of the water-supply pipe 20 is left, the pressure in the water-supply pipe 20 decreases. And, cooling performance may decrease because of decreasing of the flow amount of the coolant supplied to the cooling plate 14 of an upper step. Under the condition that the cooling device is operating, the air may be mixed into the coolant when the heat exchanger 42 is exposed to atmosphere.

And so, in the embodiment, the bypass flow path 50 is provided. The gaseous air is taken into the bypass flow path 50. And, entering of the air into the cooling plate 14 is suppressed. Since the air is accumulated in the top edge portion 20b of the water-supply pipe 20, the bypass flow path 50 is connected with the top edge portion 20b of the water-supply pipe 20.

In the embodiment, a top edge portion 30b of the waste pipe 30 is connected with the bypass flow path 50. This is because air may be accumulated in the waste pipe 30 and collection of the air is needed. However, the coolant having passed through the cooling plate 14 is exhausted to the waste pipe 30. Therefore, it is thought that influence on the cooling performance of the cooling plate 14 is small. Therefore, the connection of the waste pipe 30 with the bypass flow path 50 may be omitted in order to simplify the pipe.

In the cooling device 10 of the embodiment, a first connection member 52 is used for connecting the bypass flow path 50 with the top edge portion 20b of the water-supply pipe 20. A second connection member 54 is used for connecting the bypass flow path 50 with the top edge portion 30b of the waste pipe 30.

The bypass flow path 50 includes a first pipe 51, a second pipe 53 and a third pipe 55. The first pipe 51 connects the starting edge pipe 22 with the first connection member 52. The second pipe 53 connects the first connection member 52 with the second connection member 54. The third pipe 55 connects the second connection member 54 with the ending edge pipe 32. The first pipe 51, the second pipe 53 and the third pipe 55 are made of a rubber material from a viewpoint of flexibility and thermal insulation. However, the material of the first pipe 51, the second pipe 53 and the third pipe 55 is not limited to the rubber material. The material may be resin, metal or the like.

The first connection member 52 is provided at a connection position between the bypass flow path 50 and the top edge portion 20b of the water-supply pipe 20. The first connection member 52 is provided above the plurality of cooling plates 14. Thus, the gaseous air passes above the cooling plate 14 of the top step. Therefore, flowing of the air into the cooling plate 14 is suppressed.

The first connection member 52 has a first opening 521 extending toward the starting edge pipe 22, a second opening 522 extending toward the ending edge pipe 32, and a third opening 523 extending toward the top edge portion 20b of the water-supply pipe 20. In the first connection member 52, a first flow path 52a and a second flow path 52b are formed. Edge portions of the first flow path 52a are the first opening 521 and the second opening 522. The second flow path 52b is branched from the first flow path 52a. An edge of the second flow path 52b is the third opening 523. With the first connection member 52, it is easy to arrange the cooling device 10. It is easy to determine a positional relationship between the bypass flow path 50 and the top edge portion 20b of the water-supply pipe 20. And it is easy to keep the positional relationship. The first pipe 51 is connected to the first opening 521. The second pipe 53 is connected to the second opening 522. The top edge portion 20b of the water-supply pipe 20 is connected to the third opening 523.

The second connection member 54 connecting the bypass flow path 50 with the waste pipe 30 is the same member as the first connection member 52. That is, the second connection member 54 also has a first opening 541, a second opening 542 and a third opening 543. In the second connection member 54, a first flow path 54a and a second flow path 54b are formed. Edges of the first flow path 54a are the first opening 541 and the second opening 542. The second flow path 54b is branched from the first flow path 54a. An edge of the second flow path 54b is the third opening 543. The second pipe 53 is connected to the first opening 541. The third pipe 55 is connected to the second opening 542. The third opening 543 is connected to the top edge portion 30b of the waste pipe 30.

In this manner, when the bypass flow path 50 is provided and the coolant is provided into the bypass flow path 50, the gaseous air accumulated in the top edge portion 20b of the water-supply pipe 20 is taken into the bypass flow path 50. Thus, the entering of the air into the cooling plate 14 is suppressed. And, a cooling efficiency is maintained.

On the basis of FIG. 5A, a description will be given of a relationship between a flow path cross section S1 of the first flow path 52a and a flow path cross section S2 of the second flow path 52b. It is preferable that the flow path cross section S1 and the flow path cross section S2 satisfy a relationship of S2≤S1. The relationship is determined in order to suppress reversed flow of the coolant including the air into the water-supply path 201 of the water-supply pipe 20. In the embodiment, S2<S1 is satisfied. In order to suppress the reversed flow of the coolant including the air into the water-supply path 201 of the water-supply pipe 20, a connection member 62 illustrated in FIG. 5B may be used instead of the first connection member 52. In the first connection member 52, the first flow path 52a is vertical to the second flow path 52b. However, in the connection member 62, an angle between a second flow path 62b and a first flow path 62a is θ1 that is 90 degrees or less. That is, in FIG. 5B, when the angle θ1 is a levorotatory angle with respect to an extension direction of the first flow path 62a, a relationship of θ1<90 degrees is satisfied. Thus, the reversed flow to the second flow path 62b is suppressed.

Next, on the basis of FIG. 6, a description will be given of flow path cross sections of the bypass flow path 50. In concrete, a description will be given of a relationship between a flow path cross section S3 of the first pipe 51 and a flow path cross section S4 of the branch pipe 21a branched from the water-supply pipe 20. It is preferable that the flow path cross section S3 and the flow path cross section S4 satisfy a relationship of S3≤S4. The relationship is determined in order to prioritize the flow of the coolant into the branch pipe 21a more than the flow of the coolant into the bypass flow path 50.

When the operation of the cooling device 10 starts, the gaseous air in the cooling device 10 moves in accordance with the flow of the coolant and flows into the water-supply pipe 20. A specific gravity of the gaseous air is smaller than that of the coolant. Therefore, the gaseous air moves to the top edge portion 20b of the water-supply pipe 20 and becomes an air layer. The air accumulated in the top edge portion 20b of the water-supply pipe 20 is taken into the coolant flowing in the bypass flow path 50 through the first connection member 52. And, the coolant is released to atmosphere in the heat exchanger 42 through the waste pipe 30 and the circulation pipe 40. It is therefore possible to suppress the supply of the coolant including the gaseous air into each of the cooling plates 14 and suppress the flow amount decrease of the coolant supplied to the cooling plates 14. The gaseous air in the cooling device 10 finally moves to the heat exchanger 42 provided outside of the rack and is exhausted. Therefore, the amount of the air moving in accordance with the flow of the coolant in the cooling device 10 continuously decreases. Therefore, the changing of the coolant amount supplied to the cooling plates 14 is converged. And the cooling efficiency is kept. Even if the gaseous air is supplied to the water-supply pipe 20 again or air is newly mixed into the heat exchanger 42 or the like, the air is accumulated in the top edge portion 20b of the water-supply pipe 20 and is taken into the coolant flowing in the bypass flow path 50. Therefore, the supply of the coolant including the air into each of the cooling plates 14 is suppressed.

The cooling device 10 does not need a valve or the like. It is therefore possible to simplify the structure of the cooling device 10. When a complicated mechanism such as the valve is used, the mechanism may be broken down because of deposit of a scale, an alga, slime, rust or the like to the mechanism. In the embodiment, the breaking down does not occur. The cooling device 10 of the embodiment does not need a specific motive power. The reliability is high in this point.

Second Embodiment

Figure 7:
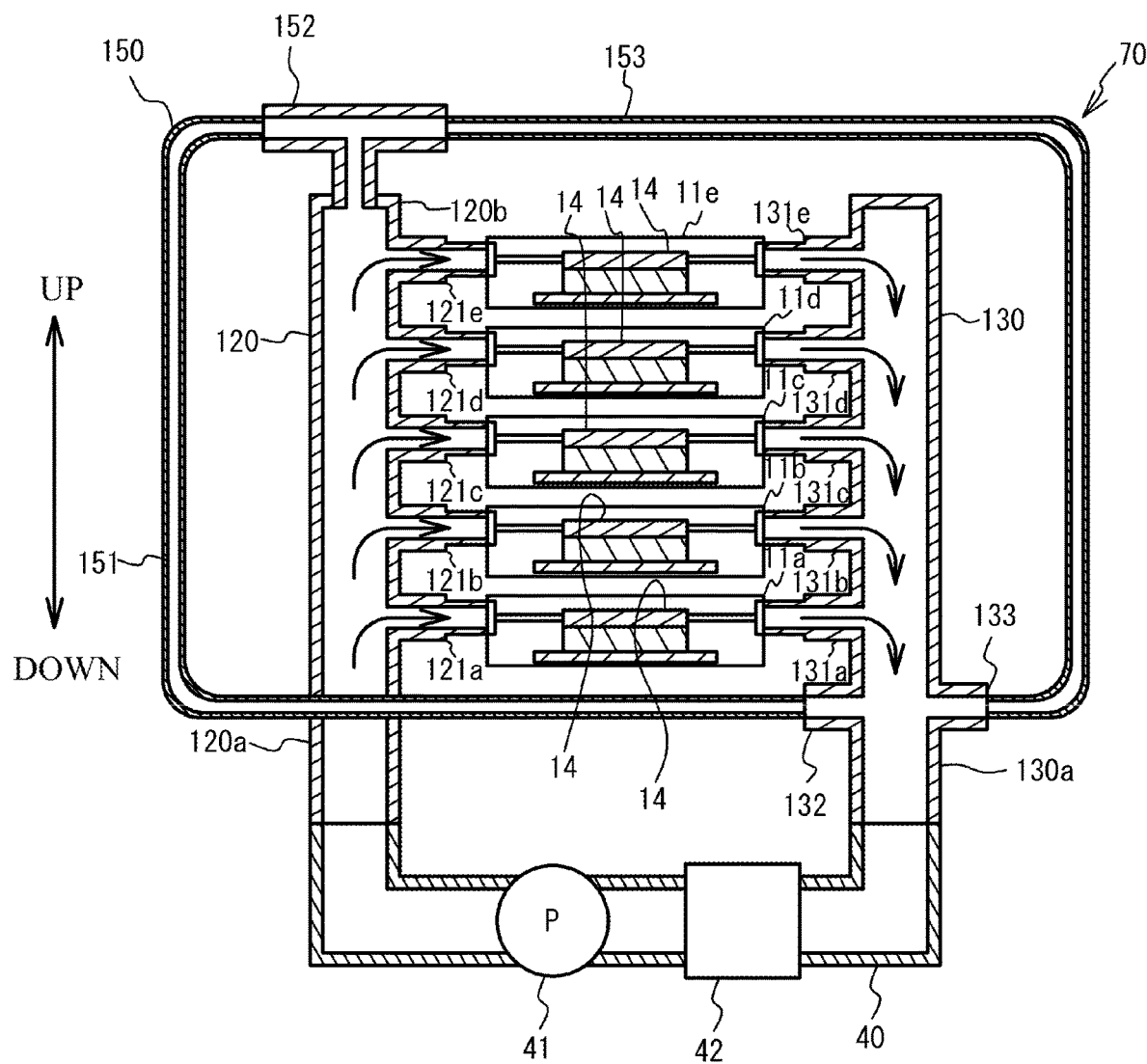
FIG. 7 illustrates an outline structure of a cooling device of a second embodiment.
Figure 8A:
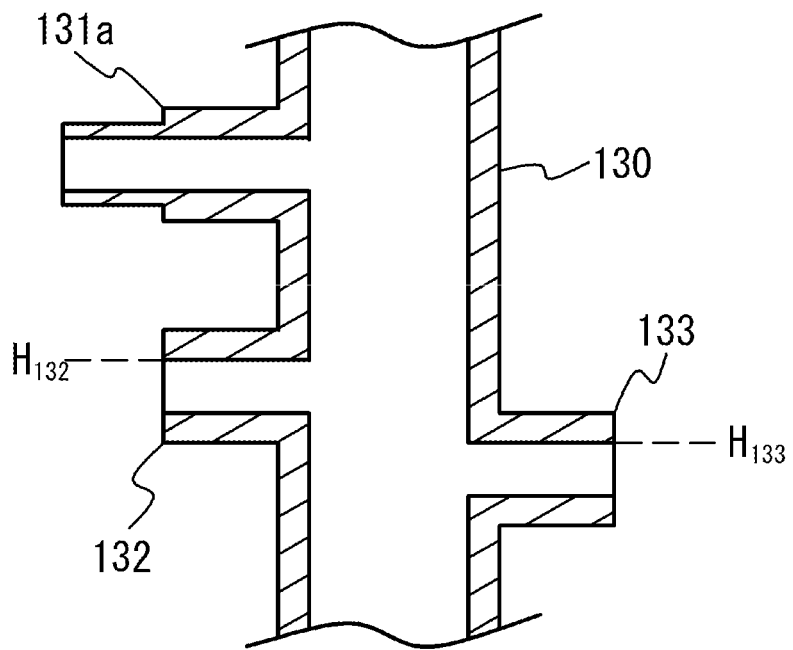
FIG. 8A illustrates a modified embodiment of a positional relationship between a starting edge pipe and an ending edge pipe in a waste pipe of a second embodiment.
Figure 8B:
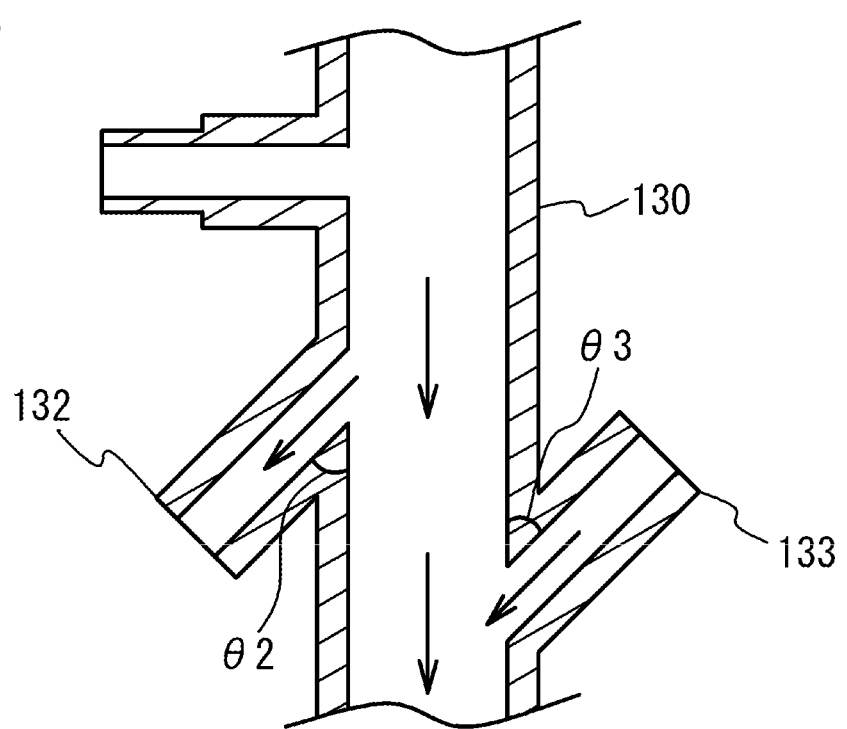
FIG. 8B illustrates a modified embodiment of a branched angle of a starting edge pipe and an ending edge pipe of a waste pipe of a second embodiment.

Next, a description will be given of a second embodiment on the basis of FIG. 7 to FIG. 8B. FIG. 7 illustrates an outline structure of the cooling device of the second embodiment. FIG. 8A illustrates a modified embodiment of a positional relationship between a starting edge pipe and an ending edge pipe in a waste pipe of the second embodiment. FIG. 8B illustrates a modified embodiment of a branched angle of the starting edge pipe and the ending edge pipe of the waste pipe of the second embodiment. The same numerals are added to common elements of the first embodiment. An explanation of details of the common element is omitted.

A cooling device 70 has a water-supply pipe 120 instead of the water-supply pipe 20 of the first embodiment. The water-supply pipe 120 is different from the water-supply pipe 20 of the first embodiment in a point that the water-supply pipe 120 does not have the starting edge pipe 22. The water-supply pipe 120 is common with the water-supply pipe 20 in a point that the water-supply pipe 120 has branch pipes 121a to 121e.

The cooling device 70 has a waste pipe 130 instead of the waste pipe 30 of the first embodiment. The waste pipe 130 has branch pipes 131a to 131e and an ending edge pipe 133 as well as the first embodiment. Moreover, the waste pipe 130 has a starting edge pipe 132.

The cooling device 70 has a bypass flow path 150 instead of the bypass flow path 50 of the first embodiment. A starting point of the bypass flow path 150 is the starting edge pipe 132 provided in the waste pipe 130. The bypass flow path 150 has a first pipe 151, a connection member 152 and a second pipe 153. The connection member 152 is the same member as the first connection member 52 of the first embodiment and is connected to a top edge portion 120b of the water-supply pipe 120. It is therefore possible to take the air accumulated in the top edge portion 120b of the water-supply pipe 120 into the bypass flow path 150. In the second embodiment, the top edge portion of the waste pipe 130 is not connected with the bypass flow path 150.

With the cooling device 70, it is possible to suppress the entering of the gaseous air into each of the cooling plates 14, as well as the first embodiment.

On the basis of FIG. 8A, a description will be given of a height position of the ending edge pipe 133. The height position of the ending edge pipe 133 may be the height position of the starting edge pipe 132 or lower. In the embodiment, as illustrated in FIG. 8A, the highest position $H_{133}$ of the inner circumference wall of the ending edge pipe 133 is lower than the highest position $H_{132}$ of the inner circumference wall of the staring edge pipe 132. This is because the coolant including the gaseous air is returned to the ending edge pipe 133 and the starting edge pipe 132 acts as a starting point of the bypass flow path 150. That is, the positional relationship is determined in order that the coolant including the gaseous air returned to the ending edge pipe 133 is not taken into the starting edge pipe 132 again. With the positional relationship, the air returned to the ending edge pipe 133 moves to the heat exchanger 42 outside of the rack and is exhausted. Thus, it is possible to gradually decrease the gaseous air in the coolant.

A branched angle θ2 of the starting edge pipe 132 and a branched angle θ3 of the ending edge pipe 133 may be set as illustrated in FIG. 8B, in order that the coolant including the air is not taken into the starting edge pipe 132 again. That is, in FIG. 8B, when the branched angle θ2 of the starting edge pipe 132 is a clockwise angle with respect to the flow direction of the coolant in the waste pipe 130, the branched angle θ2 satisfies θ2<90 degrees. In FIG. 8B, when the branched angle θ3 of the ending edge pipe 133 is a clockwise angle with respect to the flow direction of the coolant in the waste pipe 130, the branched angle θ3 satisfies θ3<90 degrees. Thus, the starting edge pipe 132 hard to take the coolant including the air.

Third Embodiment

Figure 9:
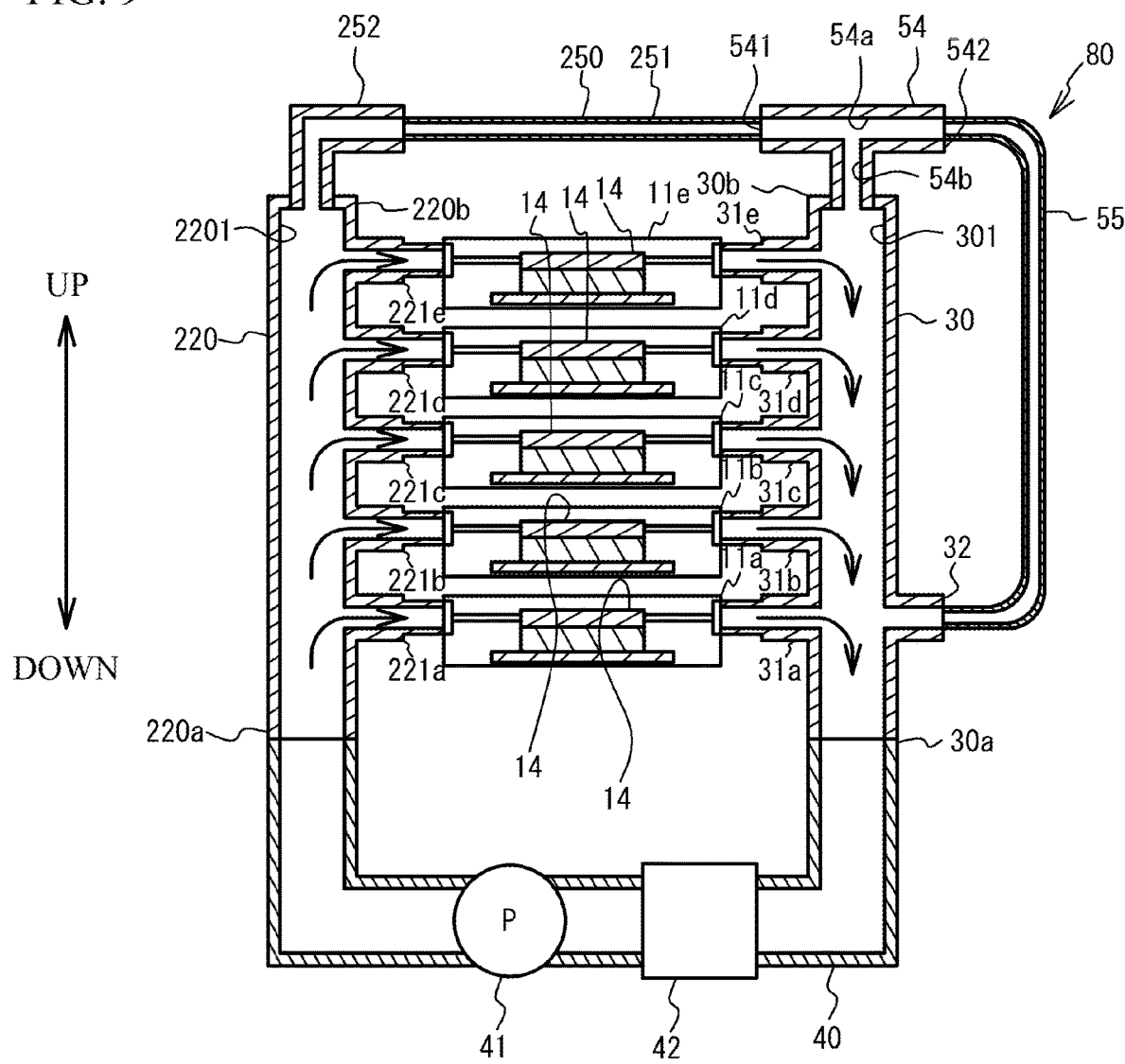
FIG. 9 illustrates an outline structure of a cooling device of a third embodiment.

Next, a description will be given of a third embodiment on the basis of FIG. 9. FIG. 9 illustrates a schematic structure of a cooling device of the third embodiment. The same numerals are added to common elements of the first embodiment. An explanation of details of the common element is omitted.

A cooling device 80 in accordance with the third embodiment has a water-supply pipe 220 instead of the water-supply pipe 20 of the first embodiment. The water-supply pipe 220 is different from the water-supply pipe 20 in a point that the water-supply pipe 220 does not have the starting edge pipe 22. The water-supply pipe 220 is common with the water-supply pipe 20 in a point that the water-supply pipe 220 has branch pipes 221a to 221e.

The cooling device 80 of the third embodiment has a connection member 252 instead of the first connection member 52 of the first embodiment. The cooling device 80 has a bypass flow path 250 instead of the bypass flow path 50 of the first embodiment. The connection member 252 is different from the first connection member 52 in a point that the connection member 252 has only two openings. One of the openings is connected to a top edge portion 220b of the water-supply pipe 220. The other is connected to a first pipe 251 forming the bypass flow path 250. However, the cooling device 80 is different from the first embodiment and does not have the starting edge pipe. Therefore, the top edge portion 220b of the water-supply pipe 220 is a starting point of the bypass flow path 250.

In the cooling device 80, the gaseous air is accumulated in the top edge portion 220b of the water-supply pipe 220. In the cooling device 80, when the coolant is introduced to the water-supply path 2201 from a water-supply inlet 220a that is provided at a bottom edge portion of the water-supply pipe 220, the coolant in the water-supply path 2201 is pressed into the bypass flow path 250.

With the cooling device 80, it is possible to suppress the entering of the air into each of the cooling plates 14 as well as the first embodiment.

Fourth Embodiment

Figure 10:
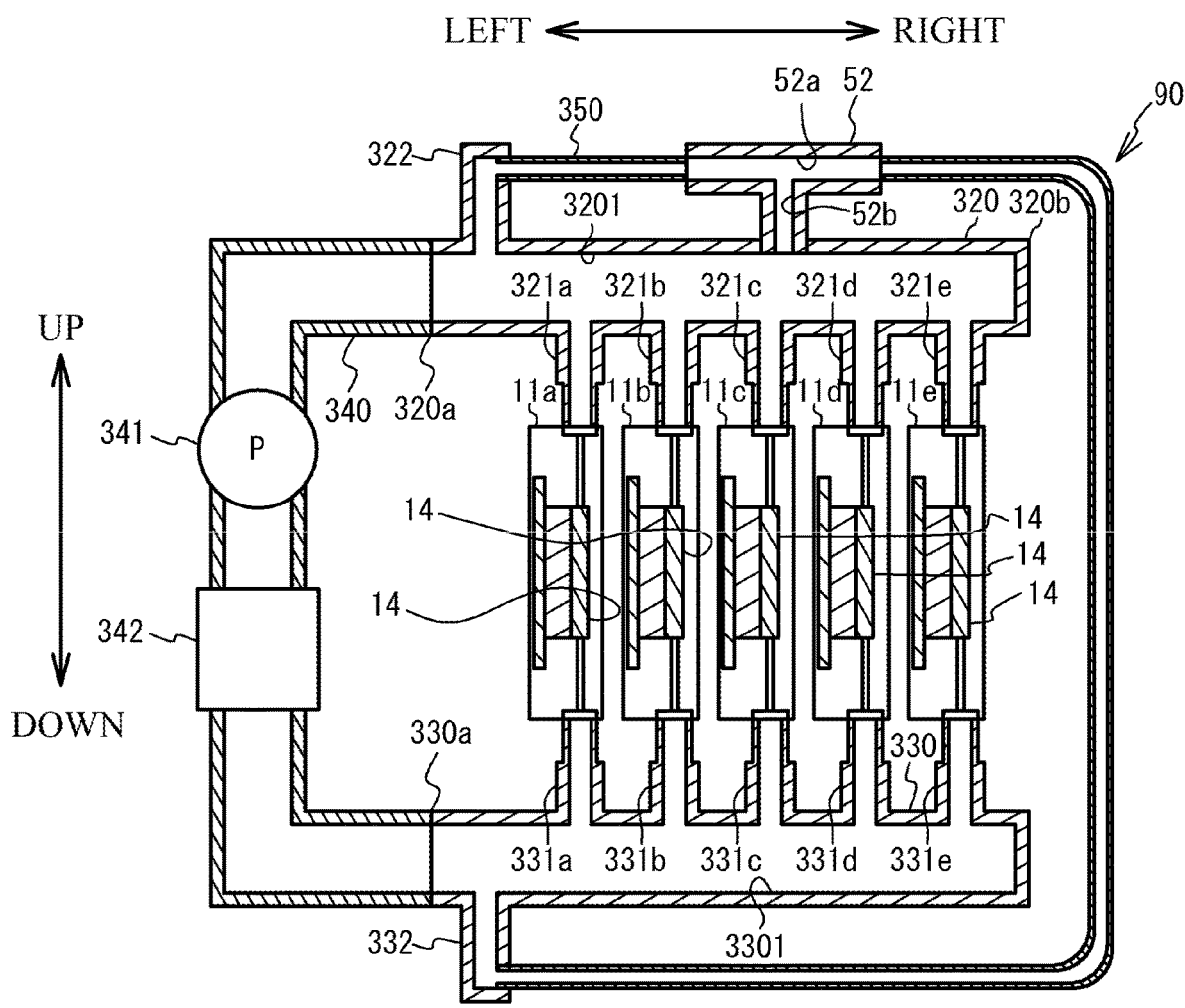
FIG. 10 illustrates an outline structure of a cooling device of a fourth embodiment.

Next, a description will be given of a fourth embodiment on the basis of FIG. 10. FIG. 10 illustrates a schematic structure of a cooling device of the fourth embodiment. The same numerals are added to common elements of the first embodiment. An explanation of details of the common element is omitted.

The fourth embodiment is different from the first embodiment in a point that the server blades 11a to 11e are parallelized in a layered shape in a right-left direction. Accordingly, the cooling plates 14 of a cooling device 90 are also arrayed in a layered shape in a right-left direction. And, a water-supply pipe 320 and the waste pipe 330 also extend in the right-left direction. The water-supply pipe 320 is arranged above the server blades 11a to 11e. The waste pipe 330 is arranged below the server blades 11a to 11e. The cooling device 90 has the water-supply pipe 320 instead of the water-supply pipe 20 of the first embodiment. The water-supply pipe 320 has branch pipes 321a to 321e as well as the first embodiment. The cooling device 90 has a waste pipe 330 instead of the waste pipe 30 of the first embodiment. The waste pipe 330 has branch pipes 331a to 331e as well as the first embodiment.

The water-supply pipe 320 is branched at an edge portion near a water-supply inlet 320a and has a starting edge pipe 322 acting as a starting point of a bypass flow path 350. The waste pipe 330 is branched at an edge portion near the outlet 330a and has an ending edge pipe 332 acting as an ending point of the bypass flow path 350. The bypass flow path 350 connects the starting edge pipe 322 with the ending edge pipe 332 through a connection position with the top edge portion of the water-supply pipe 320.

The cooling device 90 has a circulation pipe 340 connecting the water-supply inlet 320a of the water-supply pipe 320 with an outlet 330a of the waste pipe 330. The circulation pipe 340 has a pump 341 for discharging the coolant and a heat exchanger 342 for cooling the coolant. In this point, the fourth embodiment is the same as the first embodiment.

In the cooling device 90, the gaseous air is accumulated in an upper portion of a water-supply path 3201 provided in the water-supply pipe 320. And so, the coolant flowing in the bypass flow path 350 passing above the water-supply pipe 320 absorbs the air. The coolant exhausts the air into a waste path 3301 in the waste pipe 330.

With the cooling device 90, it is possible to suppress the entering of the air into each of the cooling plates 14 as well as the first embodiment.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various change, substitutions, and alterations could be made hereto without departing from the spirit and scope of the invention.

What is claimed is:

1. A cooling device comprising:
a plurality of coolers, each of which is provided in each of a plurality of electronic devices that are arrayed in a layered shape;
a water-supply pipe that has a plurality of branch pipes and supplies a coolant to the plurality of coolers, each of the branch pipes being coupled with each of the plurality of coolers;
a waste pipe that has a plurality of branch pipes, each of which is coupled with each of the plurality of coolers, the coolant having passed through the plurality of coolers being exhausted to the waste pipe;
a circulation pipe that couples an inlet of the water-supply pipe with an outlet of the waste pipe and has a pump configured to discharge the coolant and a coolant cooler configured to cool the coolant; and
a bypass flow path that is coupled with at least a top edge portion of the water-supply pipe, bypasses the plurality of coolers, and is coupled with the waste pipe.

2. The cooling device as claimed in claim 1, wherein:
the plurality of coolers are parallelized in a layered shape in an up-down direction;
the water-supply pipe and the waste pipe extend along the up-down direction;
the water-supply pipe is branched at a bottom portion and has a starting edge pipe that acts as an upstream end of the bypass flow path;
the waste pipe is branched at a bottom portion and has an ending edge pipe that acts as a downstream end of the bypass flow path; and
the bypass flow path passes through a position connected to a top edge portion of the water-supply pipe and couples the starting edge pipe with the ending edge pipe.

3. The cooling device as claimed in claim 2, wherein the starting edge pipe is positioned lower than a cooler of a bottom step among the plurality of coolers arrayed in the layered shape in the up-down direction.

4. The cooling device as claimed in claim 2, wherein the ending edge pipe is positioned lower than a cooler of a bottom step among the plurality of coolers arrayed in the layered shape in the up-down direction.

5. The cooling device as claimed in claim 2, further comprising a connection member that is provided at the position of the bypass flow path connected to the top edge portion of the water-supply pipe, the connection member having a first opening extending toward the starting edge pipe, a second opening extending toward the ending edge pipe and a third opening extending toward the top edge side of the water-supply pipe, a first flow path and a second flow path being formed in the connection member, edge portions of the first flow path being the first opening and the second opening, the second flow path being branched from the first flow path, an edge portion of the second flow path being the third opening.

6. The cooling device as claimed in claim 5, wherein a flow path cross section area of the second flow path is less than a flow path cross section area of the first flow path.

7. The cooling device as claimed in claim 2, wherein a flow path cross section area of the bypass flow path is less than a flow path cross section area of a branch pipe branched from the water-supply path.

8. The cooling device as claimed in claim 1, wherein the position of the bypass flow path connected to the top edge portion of the water-supply pipe is higher than the plurality of coolers.

9. The cooling device as claimed in claim 1, wherein:
the plurality of coolers are parallelized in a layered shape in an up-down direction;
the water-supply pipe and the waste pipe extend in the up-down direction;
the waste pipe has a starting edge pipe and an ending edge pipe, the starting edge pipe being branched at a bottom portion and acting as an upstream end of the bypass flow path, the ending edge pipe being branched at a bottom portion and acting as a downstream end of the bypass flow path; and
the bypass flow path passes through a position connected to a top edge portion of the water-supply pipe and couples the starting edge pipe with the ending edge pipe.

10. The cooling device as claimed in claim 9, wherein a height position of the ending edge pipe is less than a height position of the starting edge pipe.

11. The cooling device as claimed in claim 1, wherein:
the plurality of coolers are parallelized in a layered shape in a right-left direction;

the water-supply pipe and the waste pipe extend along the right-left direction;

the water-supply pipe has a starting edge pipe that is branched at a first edge portion thereof closer to the inlet and acts as an upstream end of the bypass flow path;

the waste pipe has an ending edge pipe that is branched at a first edge thereof closer to the outlet and acts as a downstream end of the bypass flow path; and the bypass flow path passes through a position connected to a top edge portion of the water-supply pipe and couples the starting edge pipe with the ending edge pipe.

* * * * *